(12) United States Patent
Ono et al.

(10) Patent No.: US 7,045,426 B2
(45) Date of Patent: May 16, 2006

(54) VERTICAL TYPE POWER MOSFET HAVING TRENCHED GATE STRUCTURE

(75) Inventors: Syotaro Ono, Yokohama (JP); Yusuke Kawaguchi, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/826,259

(22) Filed: Apr. 19, 2004

(65) Prior Publication Data

US 2004/0195619 A1 Oct. 7, 2004

Related U.S. Application Data

(62) Division of application No. 10/184,974, filed on Jul. 1, 2002, now Pat. No. 6,787,848.

(30) Foreign Application Priority Data

Jun. 29, 2001 (JP) .............................. 2001-198552

(51) Int. Cl.
*H01L 21/336* (2006.01)

(52) U.S. Cl. ...................... 438/270; 438/242; 438/259; 438/329; 438/330

(58) Field of Classification Search ................ 438/270, 438/242, 329, 330
See application file for complete search history.

(56) References Cited

U.S. PATENT DOCUMENTS

| 4,914,058 A | 4/1990 | Blanchard |
| 4,941,026 A | 7/1990 | Temple |
| 5,242,845 A | 9/1993 | Baba et al. |
| 5,298,781 A | 3/1994 | Cogan et al. |
| 5,637,898 A | 6/1997 | Baliga |
| 5,674,766 A | 10/1997 | Darwish et al. |
| 6,191,447 B1 | 2/2001 | Baliga |
| 6,518,127 B1 * | 2/2003 | Hshieh et al. .............. 438/270 |
| 6,621,121 B1 | 9/2003 | Baliga |

FOREIGN PATENT DOCUMENTS

| EP | 0 720 236 A2 | 7/1996 |
| EP | 1 239 523 A2 | 9/2002 |
| JP | 8-316470 | 11/1996 |
| JP | 9-246545 | 9/1997 |
| JP | 9-283535 | 10/1997 |
| JP | 2001-111050 | 4/2001 |
| WO | WO 00/74146 A1 | 12/2000 |

* cited by examiner

*Primary Examiner*—Long Pham
(74) *Attorney, Agent, or Firm*—Oblon, Spivak, McClelland, Maier & Neustadt, P.C.

(57) ABSTRACT

A power MOSFET comprising a drain layer of a first conductivity type, a drift layer of the first conductivity type provided on the drain layer, a base layer of a first or a second conductivity type provided on the drift layer, a source region of the first conductivity type provided on the base layer, a gate insulating film formed on an inner wall surface of a trench penetrating the base layer and reaching at the drift layer, and a gate electrode provided on the gate insulating film inside the trench, wherein the gate insulating film is formed such that a portion thereof adjacent to the drift layer is thicker than a portion thereof adjacent to the base layer, and the drift layer has an impurity concentration gradient higher in the vicinity of the drain layer and lower in the vicinity of the source region along a depth direction of trench.

4 Claims, 13 Drawing Sheets

VERTICAL TYPE POWER MOSFET HAVING TRENCHED GATE STRUCTURE

This application is a Division of application Ser. No. 10/184,974 filed on Jul. 1, 2002, now U.S. Pat. No. 6,787,848 incorporated herein by reference.

CROSS-REFERENCE TO RELATED APPLICATIONS

This application is based upon and claims the benefit of priority from the prior Japanese Patent Application No. 2001-198552, filed Jun. 29, 2001, the entire contents of which are incorporated herein by reference.

BACKGROUND OF THE INVENTION

1. Field of the Invention

The present invention relates to a semiconductor device, and particularly to a vertical type power MOSFET having a trenched gate structure.

2. Description of the Related Art

A trench is formed in a semiconductor substrate, and this trench is used to form a trenched gate structure. These trenched gate structures are used in semiconductor devices such as an IGBT (Insulated Gate Bipolar Transistor) and a MOSFET (MOS-type Field Effect Transistor), and this is particularly advantageous for electrical power applications. For example, because a power MOSFET having a trenched gate structure can attain high switching speeds, high current capacities and a breakdown voltage of about several tens volts to 100 volts, they are widely used for switching a power source in portable devices or personal computers.

An n channel type power MOSFET having a trenched gate structure will be described in the following as an example of such a power MOSFET.

It is to be noted that FIG. 20 does not represent a prior art. It is a schematic sectional view of the main portions of an n-channel type trench gate structure power MOSFET which was experimentally designed by the present inventors in the process of achieving the present invention.

That is to say, FIG. 20 illustrates, as an example of a power MOSFET, a cross sectional of one half (half pitch) of a paired vertical type MOSFETS in the plurality of units serially formed on a semiconductor substrate.

The schematic structure is such that an n− type drift layer 108 and a p type base layer 110 are formed as a laminated body in sequence on the semiconductor substrate used as a drain layer 112, and a trench T is formed on the laminated body. A gate electrode 104 is formed on the surface of the inner wall of the trench T with a gate insulating film 102 interposed therebetween.

The drain electrode 114 is formed at the bottom surface side of the n+ type drain layer 112 which is the semiconductor substrate. An n+ type source region 116 which is adjacent to the gate insulating film 102, and the p+ type region 118 which is formed adjacent thereto are provided on the p+ type base layer 110, and a source electrode 120 is formed so as to extend across these regions 116 and 118.

In this type of power MOSFET, when a predetermined voltage is applied to the gate electrode 104, an inverse layer is formed on the region adjacent to the gate insulating film 102 of the p-type base layer 110, and the power MOSFET turns on and current flows between the source electrode 120 and the drain electrode 114.

However, in the type of power MOSFET shown in FIG. 20, there is a problem that even if the devices are made small, the turn-on resistance or on resistance thereof cannot be effectively reduced.

That is to say, in the case of the type of power MOSFET shown in FIG. 20, the resistance of the device in the on state, that is the on resistance, is determined mainly by the channel resistance component and the drift resistance component. The channel resistance component is the resistance component of the channel region formed on the inverse layer of the p-type base layer 110 in the on state. On the other hand, the drift resistance component is the resistance component which appears for the on current in the n-type drift layer 108.

In order to reduce the on resistance of the device, the pitch P of the device unit in FIG. 20 was reduced to thereby increase device density on the semiconductor substrate. That is, the channel density was increased and thus the on resistance of the device was decreased.

Due to the quick advances in semiconductor size reduction processing technology in recent years, the channel density is being rapidly increased, and the channel resistance component is being greatly reduced. Specifically, size reduction has advanced to the extent that the device pitch P is below 0.5 μm. FIG. 20 shows the half pitch structure which is one half the paired device unit. However, in the actual device in which the structure shown in the figure is juxtaposed in both sides thereof, the width of the p-type base layer 110 which is sandwiched between the two adjacent trenched gate structures has been made so small that it is substantially equal to the pitch P, and is less than 0.5 μm.

Further, under these conditions, the on resistance of the recent power MOSFET is such that the above-mentioned drift resistance component has come to account for approximately two-thirds of the total resistance.

That is to say, even when the manufacturing process is further improved and the device pitch P becomes even smaller, there is the problem that significant reduction in the on resistance of the device can not be expected.

For example, in the case of a power MOSFET of the type having a breakdown voltage of 30 volts, it is extremely difficult to reduce the on resistance to 20 mΩmm$^2$ or less.

In order to solve this problem, it is necessary to reduce the thickness t of the drift layer 108, thereby reducing the drift resistance component. In order to do this, a method can be considered in which the gate insulating film 102 is made thicker and when voltage is applied between the gate electrode 104 (the source electrode 120) and the drain electrode 114, the gate insulating film 102 is caused to receive a portion of the applied voltage and thus the thickness of the drift layer 108 can be reduced.

FIG. 21 is a schematic view showing the cross-section structure of the power MOSFET formed based on this concept. The device shown in FIG. 21 is the same as that shown in FIG. 20 except that the thickness of the gate insulating film 102 is greater than that in FIG. 20. Thus the components are indicated by the same reference numerals. That is to say, in the power MOSFET shown in FIG. 21, by making the gate insulating film 102 thicker, the portion by which the thickness is increased receives a portion of the applied voltage, and thus the thickness t of the drift layer 108 is reduced.

However, when the thickness of the gate insulating film 102 is increased in this manner, the threshold voltage of the power MOSFET is increased. As a result, the on resistance is increased by the amount by which the channel resistance is increased when the same gate voltage is applied, and a problem is caused that on resistance of the device can not be effectively reduced.

As described above, in the power MOSFET having this structure, because the on resistance is determined by the drift resistance component, there is the problem that even if the device is made smaller, the on resistance thereof can not be efficiently reduced.

BRIEF SUMMARY OF THE INVENTION

A power MOSFET of one aspect of the present invention comprises: a drain layer having a first conductivity type; a drift layer having the first conductivity type provided on the drain layer; a base layer having a second conductivity type provided on the drift layer; a source region having the first conductivity type provided on the base layer; a gate insulating film formed on the inner wall surface of a trench formed through the base layer and reaching at the drift layer; a gate electrode provided inside the gate insulating film provided in the trench, wherein the gate insulating film has a portion adjacent to the drift layer thicker than the portion adjacent to the base layer, and the drift layer has an impurity concentration gradient higher in the vicinity of the drain layer and lower in the vicinity of the source region along a depth direction of the trench.

According to another aspect of the present invention, a power MOSFET comprises: a drain layer having a first conductivity type; a drift layer having the first conductivity type provided on the drain layer; a base layer having the first conductivity type provided on the drift layer; a source region having the first conductivity type provided on the base layer; a gate insulating film formed on the inner wall surface of a trench formed through the base layer and reaching at the drift layer; a gate electrode provided inside the gate insulating film provided in the trench, wherein the gate insulating film has a portion adjacent to the drift layer thicker than the portion adjacent to the base layer, and the drift layer has an impurity concentration gradient higher in the vicinity of the drain layer and lower in the vicinity of the source region along a depth direction of the trench.

DETAILED DESCRIPTION OF THE INVENTION

Various embodiments and modifications of the present invention are described in the following, with reference to the drawings.

Figure 1:
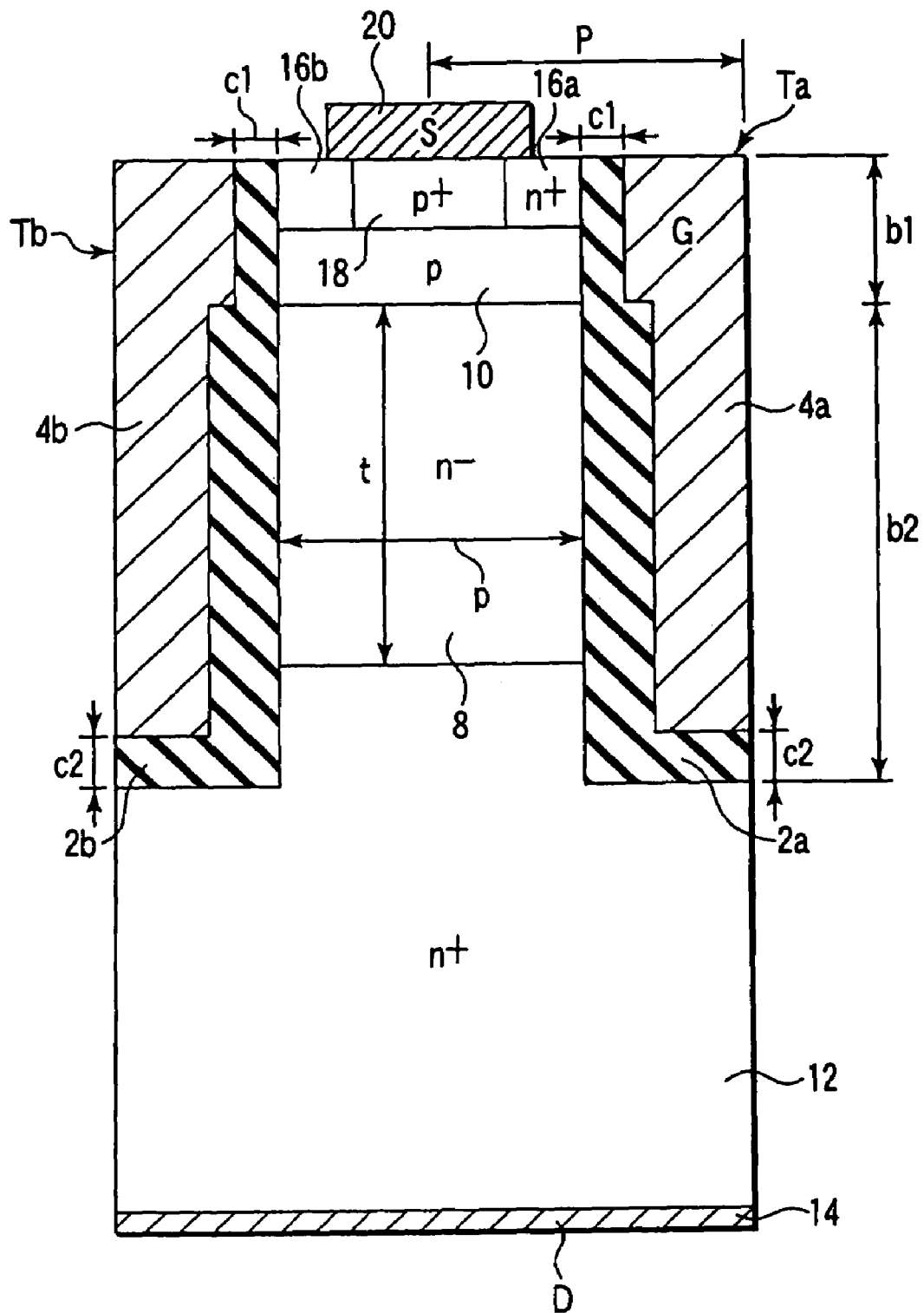
FIG. 1 is a schematic cross-sectional view showing the structure of the main portions of a power MOSFET having the n channel type trenched gate structure according to a first embodiment of the present invention.

FIG. 1 illustrates a cross-sectional view of a power MOSFET having the n channel trenched gate structure according to the first embodiment of the present invention for showing a structure of one of the plurality of device units formed on the semiconductor substrate.

The schematic structure thereof is such that the n− type drift layer 8 and the p type base layer 10 are disposed on the drain layer 12 which is the n+ type semiconductor substrate. Further, a pair of n+ type source layers 16a and 16b is formed on the p-type base layer 10 such that the p+ layer 18 is disposed therebetween. Trenches Ta and Tb respectively, are formed along the side surfaces of the source layers 16a and 16b, the base layer 10, drift layer 8 and upper portion of drain layer 12. The lowermost end of the trenches Ta and Tb terminate at an inner portion of the drain layer 12.

Gate electrodes 4a and 4b are formed so that the gate insulating films 2a and 2b which are formed respectively on the surface of the inner walls of the trenches Ta and Tb are interposed therebetween to form trenched gate structures. The trenched gate structures each is formed so as to pass through the p type base layer 10 and the n type drift layer 8, from the side of the source regions 16a and 16b of the device (which are described hereinafter), and reaches the n+ type drain layer 12 which is the semiconductor substrate.

The n+ type source regions 16a, 16b which are adjacent to the trenched gate structures and the p+ type region 18 which is formed adjacent thereto are provided on the p-type base layer 10, and the source electrode 20 is formed so as to extend across these regions 16a, 16b and 18. On the other hand, the drain electrode 14 is formed on the back surface of the n+ type drain region 12.

In the embodiment of the power MOSFET shown in FIG. 1, the thickness of the gate insulating films 2a and 2b changes such that two steps are formed, and this is a feature of the present embodiment. That is, in the trenched gate structure, the gate insulating films 2a and 2b are formed to have thin portions facing the source regions 16a, 16b and the p type base layer 10, and thick portions facing the drift layer 8 and the n+ type drain layer 12. By varying the thickness of the gate insulating films 2a and 2b such that it is thin at the source side, and thick at the drain side, the voltage between the gate G (or the source S) and the drain D can be held by the thick portions of the gate insulating films 2a and 2b, without increasing the threshold value of the device, and thus the drift layer 8 can be made thin. Therefore the inner resistance of the drift layer 8 can be lowered.

That is to say, in the portions b1 of the gate insulating films 2a, 2b which face the p-type base layer 10 having channels formed in the inverse layer, the thickness C1 of the gate insulating films 2a and 2b is small.

Since the gate insulating films 2a, 2b facing the base layer 10 are made thin in this manner, when the same voltage is applied, the threshold value of the power MOFSET is made lower than a case where the gate insulating film is thick. At the same time, the amount of current flowing in the channel increases due to the expanded inversion layer, and the on resistance of the device is reduced.

Also, by the gate insulating films 2a and 2b being formed so as to be thick in the portions b2 which extend from the portion which face the upper portion of the drift layer 8 to the portion which opposes a part of the drain layer 12, some of the voltage applied between the drain D and the gate G (or the source S) can be held by the thick portions b2 of the gate insulating films 2a and 2b. As a result, the thickness t of the drift layer 8 can be decreased and the drift resistance component can be effectively reduced. Consequently, it becomes possible to decrease the on resistance of the device.

In addition to decreasing the thickness of the drift layer 8 in this manner, in the embodiment shown in FIG. 1 the structure is such that the trenched gate structure penetrates the thin drift layer 8 as well as partially into the drain layer 12. However, as in the modification of this embodiment which is described hereinafter, the trenched gate structure does not need to penetrate through the drift layer 8 and to reach at the drain layer 12. The trenched gate structure may be formed so that the drift layer 8 is not penetrated completely.

Further, a second feature of the embodiment of the power MOSFET shown in FIG. 1 is the impurity concentration gradient of the drift layer 8. That is to say, in the first embodiment of the present invention, the impurity concentration gradient in the drift layer 8 is not fixed to be constant when viewed in the depth direction of the trenches Ta, Tb, but to have a unique distribution. The drift resistance component in the drift layer 8 can be further reduced effectively.

Figure 2:
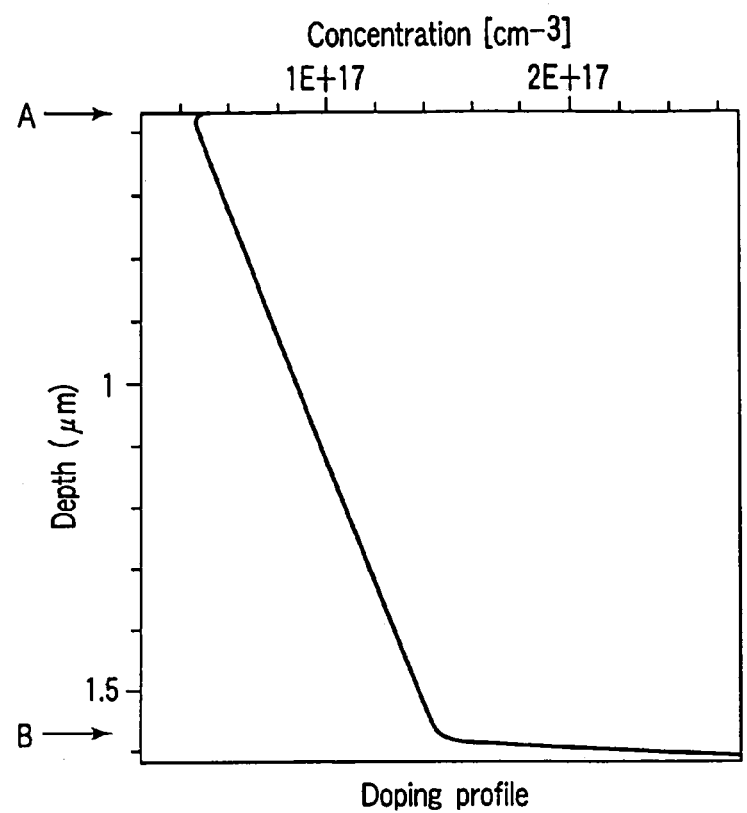
FIG. 2 is a graph showing an impurity concentration gradient in the depth direction of the drift layer 8 of the power MOSFET of the first embodiment of the present invention.

FIG. 2 is a graph showing an impurity concentration gradient in the depth direction of the drift layer 8 of the power MOSFET of an embodiment of the present invention shown in FIG. 1. In this embodiment, as shown in FIG. 2, the concentration of n type impurities in the drift layer 8 increases sequentially or linearly when viewed in the depth direction of the drift layer 8 or trenches Ta, Tb.

As shown in FIG. 2, it is desirable that the impurity concentration at the upper end A of the drift layer 8 which is the portion adjacent to the p-type base layer 10, is set at 5.5E+16 or $5.5 \times 10^{16}/cm^3$. Further, according to the experiments of the inventors, it is known that the impurity concentration should be in the range between $1 \times 10^{16}$ and $9 \times 10^{16}/cm^3$. If the impurity concentration exceeds this value, the breakdown voltage of the device is insufficient. Conversely, if the impurity concentration at the upper end A is less than this value, the on resistance can not be sufficiently reduced.

Further, if the balance between the breakdown voltage and the on resistance of the device is taken into consideration, for better practical applications, the impurity concentration of the drift layer 8 at the upper end A, is preferably within a range of $3 \times 10^{16}$ to $7 \times 10^{16}/cm^3$ and more preferably a range of $4 \times 10^{16}$ to $6 \times 10^{16}/cm^3$.

Next, the case in which the impurity concentration of the drift layer 8 at lower end B, that is, the impurity concentration of the portion adjacent to the drain layer 12, is changed in the same manner as in FIG. 2, will be described in the following.

Figure 3:
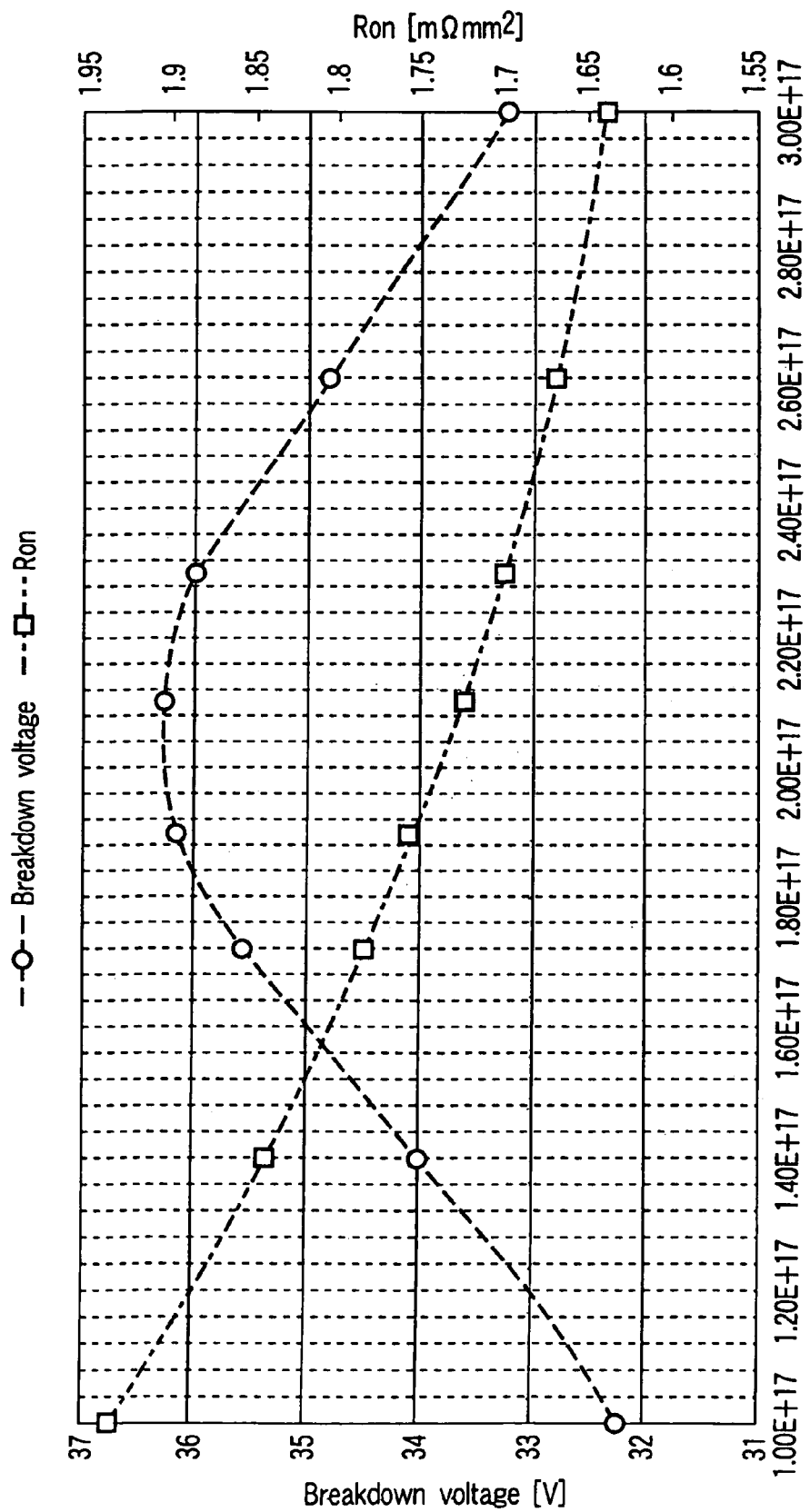
FIG. 3 is a graph showing the dependency of the breakdown voltage V and the on resistance Ron of the power MOSFET on the impurity concentration at the lower end of the drift layer 8 shown in FIG. 1.

FIG. 3 is a graph showing the dependency of the breakdown voltage V and the on resistance Ron of the power MOSFET shown in FIG. 1 on the impurity concentration at the lower end B of the drift layer 8.

That is to say, the abscissa in FIG. 3 shows the impurity concentration at the lower end B of the drift layer 8, and the left side ordinate shows the breakdown voltage of the power MOSFET, while the right side ordinate shows the on resistance Ron. It is to be noted that here the impurity concentration at the upper end A is fixed at $5.5 \times 10^{16}/cm^3$.

Further, the parameters of the device structure used here are as follows. The half pitch P of the device unit shown in FIG. 1=0.4 μm; the thickness t of the drift layer 8=1.2 μm; the thickness of thin portion b1 of the gate insulating film=0.5 μm; the thickness of the thick portion b2 of the gate insulating film=1.5 μm; the thickness c1 of the thin gate insulating film=0.015 μm; and the thickness c2 of the thick gate insulating film=0.15 μm.

From FIG. 3, it can be seen that the on resistance Ron of the device decreases as the impurity concentration at the lower end B is increased, while the breakdown voltage V has a maximum value for a specific impurity concentration. For example, for an impurity concentration of the drift layer 8 of approximately 2.1E+17, that is, $2.1 \times 10^{17}/cm^3$, the breakdown voltage reaches its peak value of approximately 36.3 volts, and the on resistance at this time is approximately 1.73 mΩmm$^2$.

Figure 20:
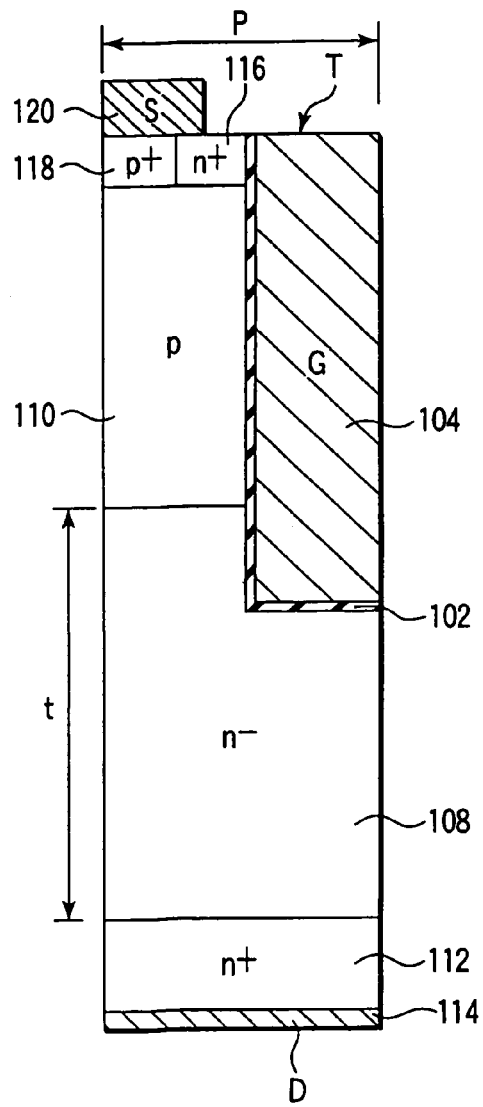
FIG. 20 is a schematic view showing a cross-section of the main portions of an n-channel type trenched gate structure MOSFET which was experimentally designed by the present inventors in the process of achieving the present invention.
Figure 21:
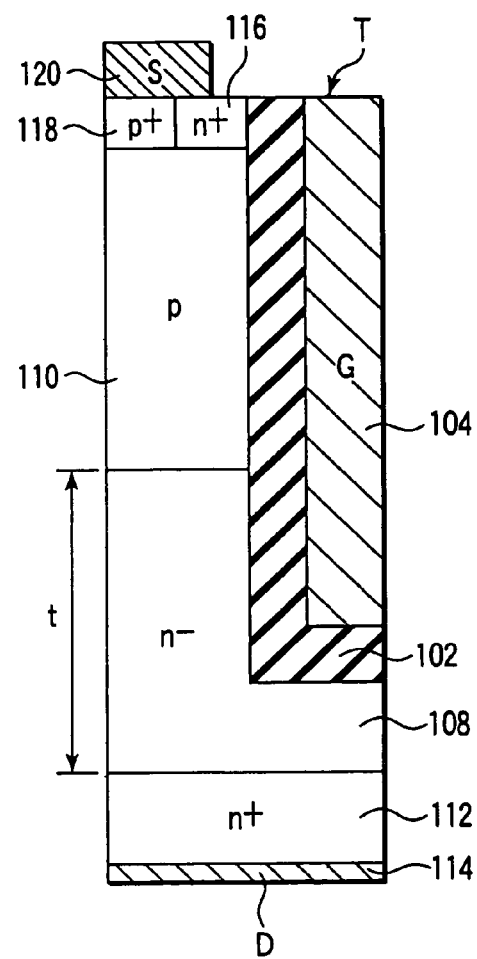
FIG. 21 is a schematic view showing a cross-section of the power MOSFET of the experimental structure of FIG. 20 in which the gate insulating film has been made thicker than that shown in FIG. 20.

Further, if the impurity concentration at the lower end of drift layer 8 is approximately $2.3 \times 10^{17}/cm^3$, the breakdown voltage of the device is 36 volts, and the on resistance Ron is approximately 1.7 mΩmm$^2$. The on resistance of this embodiment is decreased by approximately 1/10 when compared with that shown in FIGS. 20 and 21, for example, in which the impurity concentration of the drift layer was fixed constant in the depth direction of the trench.

More generally, as shown in FIG. 3, it is preferable that the impurity concentration of the drift layer 8 in the portion B adjacent to the drain layer 12 is in the range of $1\times10^{17}$ to $3\times10^{17}/cm^3$. Further, if the balance between the breakdown voltage and the on resistance of the device is taken into consideration, the impurity concentration of the drift layer 8 at the portion B adjacent to the drain layer 12, is preferably within a range of $1.7\times10^{17}$ to $2.4\times10^{17}/cm^3$. Further, at the portion B adjacent to the drain layer 12, the impurity concentration is even more preferably within the range of $1.8\times10^{17}$ to $2.3\times10^{17}/cm^3$ since a breakdown voltage exceeding 36 volts can be attained.

In this embodiment, by causing the distribution of the impurity concentration of the drift layer 8 to be as shown in FIG. 2, such that it increase sequentially when viewed in the depth direction of the trenches Ta and Tb, it becomes possible for the breakdown voltage to be maintained while the on resistance of the device is decreased remarkably.

It is to be noted that in FIG. 2, the impurity concentration of the drift layer 8 is varied such that the distribution is substantially linear. However, this embodiment is not limited thereto, and the impurity concentration may be changed so as to be curved or to form steps. That is to say, other distributions fall within the scope of the present embodiment provided that the impurity concentration of the drift layer 8 is substantially sequentially increased when viewed from the depth direction of the trenches Ta and Tb, and the same effects of the embodiment are obtained. For example, as described later, a plurality of layers each having different impurity concentration may be laminated to form the drift layer 8.

Further, by making a further adjustment to the impurity concentration of the drift layer 8, the inventors conceived of a way to further maintain the breakdown voltage while further lowering the on resistance.

Figure 4:
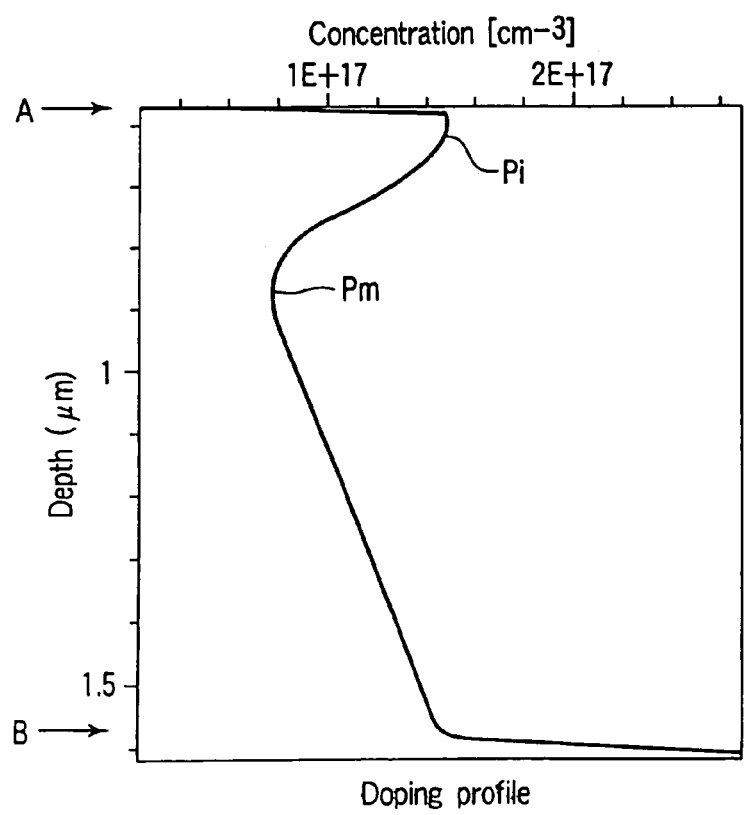
FIG. 4 is a graph showing another example of the impurity concentration distribution of drift layer 8 according to another embodiment of the present invention.

FIG. 4 is a graph showing another example of the impurity concentration distribution of drift layer 8 of the embodiment. That is, the ordinate in FIG. 4 shows the distance in the depth direction of the drift layer 8 and the abscissa shows the impurity concentration of the drift layer 8.

In the example of the impurity concentration distribution shown in FIG. 4, the impurity concentration distribution is substantially V-shaped when viewed in the depth direction of the trenches Ta and Tb. In other words, it can be said that this is a impurity concentration distribution in which a highly doped impurity concentration region having a peak value Pi has been added to the upper side, that is the portion A that contacts the p-type base layer 10, in a impurity concentration distribution such as that shown in FIG. 2.

The inventors carried out quantitative assessments of the devices having an impurity concentration distribution such as that shown in FIG. 4.

Figure 5:
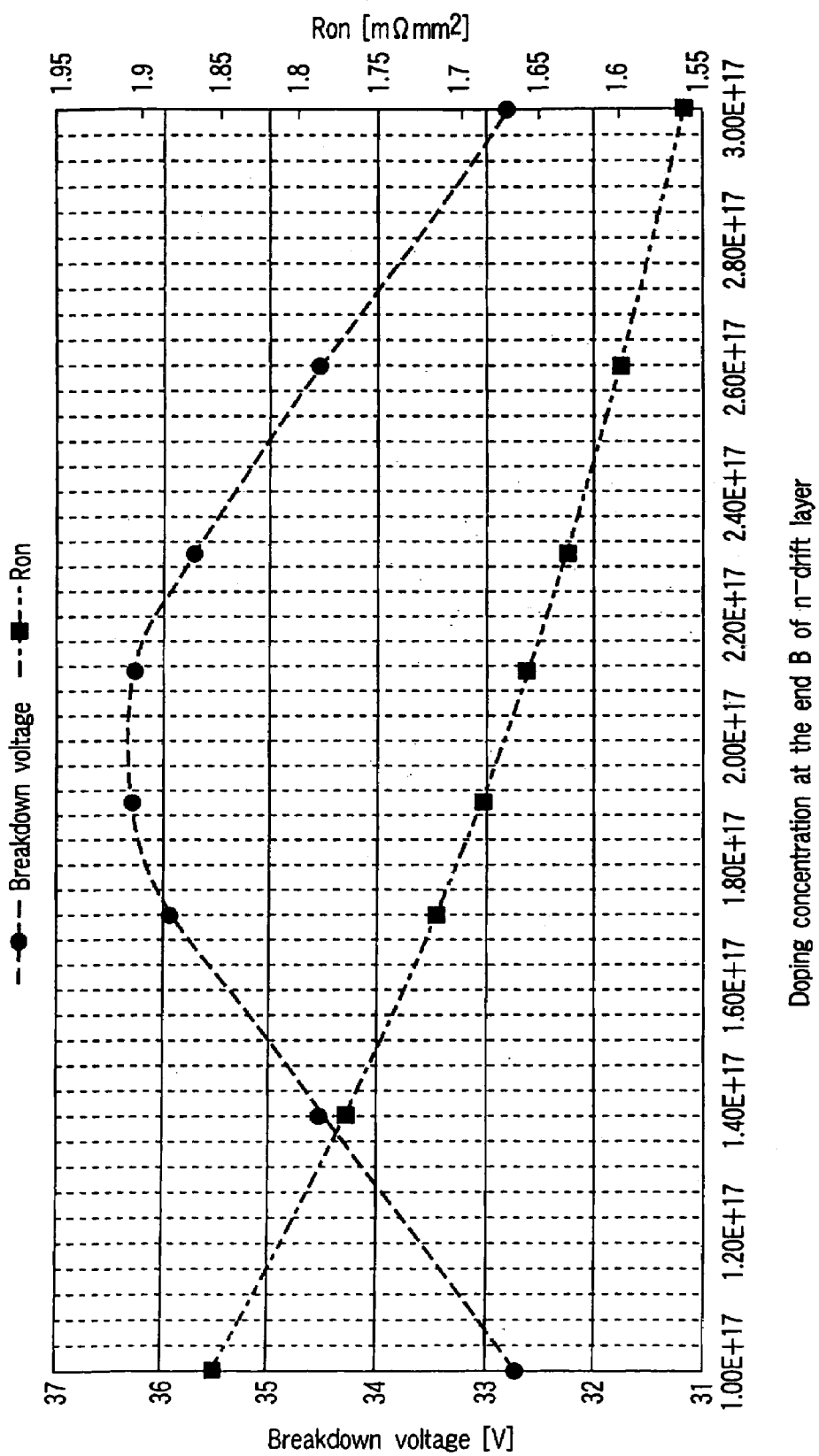
FIG. 5 is a graph showing the dependency of the breakdown voltage V and the on resistance Ron of the power MOSFET for the impurity concentration at the lower end of the drift layer 8, when the impurity concentration distribution of FIG. 4 is applied to the drift layer 8.

FIG. 5 is a graph showing the dependency of the breakdown voltage V and the on resistance Ron of the power MOSFET, on the impurity concentration at the lower end B of the drift layer 8 in the case of the impurity concentration distribution of FIG. 4.

That is to say, the abscissa of FIG. 5 shows the impurity concentration at the lower end B of the drift layer 8, while the left side ordinate shows the breakdown voltage V of the power MOSFET, and the right side ordinate shows the on resistance Ron.

It is to be noted that the parameters of this device structure are the same as those listed above for FIG. 3. Also, as shown in FIG. 4, the impurity concentration of the peak value Pi at the upper end A of the drift layer 8 is fixed at $1.5\times10^{17}/cm^3$.

It can be seen from FIG. 5 that the on resistance Ron of the device decreases as the impurity concentration at the lower end B is increased, while the breakdown voltage V has a maximum value with respect to a specific impurity concentration. This tendency is the same as the device exemplified in FIG. 3. However, when compared with that in FIG. 3, it is seen that the breakdown voltage is maintained at substantially the same level and the on-resistance Ron is significantly decreased.

For example, as can be seen in FIG. 5, the impurity concentration of the lower end B of drift layer 8 is approximately $1.9\times10^{17}/cm^3$ to $2.1\times10^{17}/cm^3$, and the breakdown voltage of the device reaches the peak value of approximately 36.3 volts. In addition the on resistance Ron at this time is approximately 1.68 volts when the impurity concentration is $1.9\times10^{17}/cm^3$ and it decreases to approximately 1.66 volts when the impurity is $2.1\times10^{17}/cm^3$. That is to say, when compared with FIG. 3, the breakdown voltage is substantially the same while the on resistance decreased by approximately 10 percent.

Referring to FIG. 4 once again, a more general case will be described. It is preferable that the impurity concentration of the upper end A of the drift layer 8, that is the portion adjacent to the p-type base layer 10 is in the range of $1\times10^{17}$ to $3\times10^{17}/cm^3$. If the impurity concentration at the upper end A exceeds this value, the breakdown voltage of the device is insufficient. Conversely, if the impurity concentration at the upper end A is less than this value, the on resistance can not be sufficiently reduced.

Further, if the balance between the breakdown voltage and the on resistance of the device is taken into consideration, for better practical application, the impurity concentration of the drift layer 8 at the upper end A, is preferably within a range of $1.4\times10^{17}$ to $2\times10^{17}/cm^3$.

On the other hand, at the portion Pm in which the impurity concentration of the drift layer 8 has the minimum value, the value is preferably in the range of $1\times10^{16}$ to $9\times10^{16}/cm^3$.

Further, it is preferable that the impurity concentration of the drift layer 8 in the portion B adjacent to the drain layer 12 is in the range of $1\times10^{17}$ to $3\times10^{17}/cm^3$, as shown in FIG. 5. Also, if the balance between the breakdown voltage and the on resistance of the device is taken into consideration, the impurity concentration of the drift layer 8 at the portion B adjacent to the drain layer 12, is preferably within a range of $1.4\times10^{17}$ to $2.6\times10^{17}/cm^3$. Further, if the impurity concentration at this portion B is made to be within the range of $1.7\times10^{17}$ to $2.2\times10^{17}/cm^3$, a remarkable effect is achieved since a breakdown voltage exceeding 36 volts can be achieved.

It is to be noted that the impurity concentration of the drift layer 8 and the drain layer 12 differ by two digits and thus the concentration of the electric field at the interface between the two layers 8 and 12 raises a problem. In the present embodiment, by causing the film thickness b2 of the gate insulating films 2a and 2b facing the drift layer 8 to be thick, the critical electric field can be raised. Further, by providing the drift layer 8 with this type of impurity concentration gradient, the concentration of the electric field in only the border portion of the layers 8 and 12 can be controlled. The concentration region of the electric field is made to expend from the lower portion B of the drift layer 8 which is close to the drain layer 12 to the middle portion thereof and the degree of the field concentration can be decreased. As a result the breakdown voltage increases and the doping level of the impurity in the drift layer 8 can be raised, and thus the on resistance can be reduced.

Figure 6:
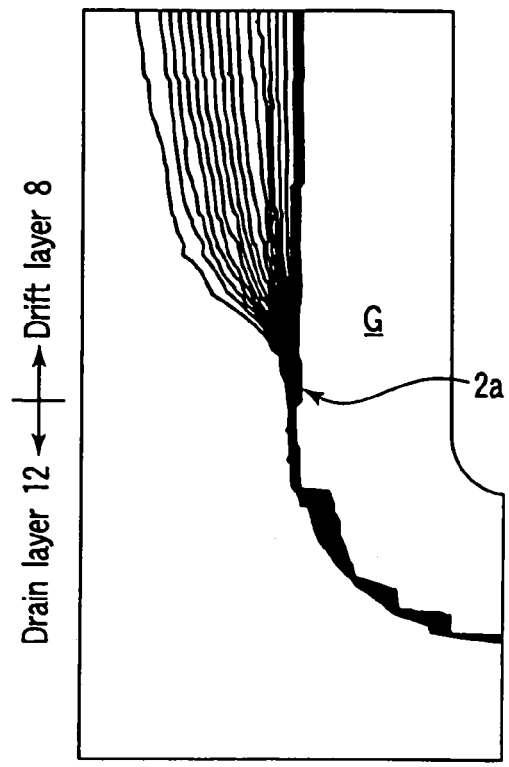
FIG. 6 shows an example of the electric field distribution inside the device shown in FIG. 1 when 20 volts are applied to the drain electrode 12.

FIG. 6 is a schematic view showing an example of the electric field distribution at the interface between the drift layer 8 and the drain layer 12 of the one half device made in the right side trench Ta of the full-pitch device shown in FIG. 1. In this case, 20 volts are applied to the device of the embodiment of the present invention.

Figure 7:
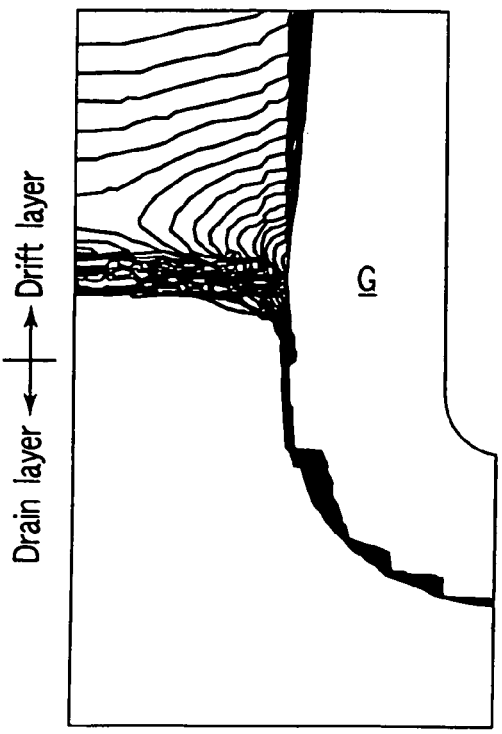
FIG. 7 shows an example of the electric field distribution having a constant impurity concentration distribution at the portion of the device shown in FIG. 20 or 21 corresponding to that shown in FIG. 6.

FIG. 7 shows an enlarged view of a corresponding portion of the electric field distribution of FIG. 6. FIG. 6 shows the electric field distribution when the impurity concentration of the drift layer 8 is set as shown in FIG. 2 or FIG. 4. FIGS. 2 and 4 show in a case where the impurity concentration distributions in the drift layer 8 adjacent to the drain layer 12 have similar profiles.

In the case of the device of FIG. 7, in order for the on resistance to be almost at the same level as that of the device in FIG. 6, the concentration of the n-type impurities in the entire drift layer was made $1.45 \times 10^{17}/cm^3$. The result of this assessment using the field distributions shown in FIGS. 6 and 7, the breakdown voltage when the impurity concentration of the drift layer is fixed (FIG. 7) was approximately 34 volts, while the breakdown voltage could be increased to approximately 36.3 volts in the case of FIG. 6 which has a substantially V-shaped impurity concentration distribution based on this embodiment. That is, when compared to the case in which the impurity concentration of the drift layer is fixed constant, in this embodiment, when the on resistance of the device is at the same level, the breakdown voltage can be made higher.

In the embodiment of FIG. 1, the reason the properties are improved in the device in which the drift layer 8 provides the V-shaped impurity concentration distribution exemplified in FIG. 4 will be described in the following.

Firstly, by imparting from the portion A to the portion B of the drift layer 8 with a concentration gradient which increases linearly up to the drain layer 12, as described above, the concentration of the electric field between the drift layer 8 and the drain layer 12 is lessened and a reduction of the on-resistance is achieved.

Further, as shown in FIG. 4, when the channel formed in the inversion layer is turned on, the highly doped impurity concentration region on the upper side A of the drift layer 8 can receive much current flow in the base layer 10 side. Thus, lessening of the electric field and a reduction in the on resistance can be simultaneously realized. This is because the region of the concentration of electric field on the lower side B is isolated, and even if the impurity concentration at the upper side A is increased, no effect is applied to the side A and relaxing of the electric field can be achieved.

When the electric field distributions at the time of 20-volt application shown in FIGS. 6 and 7 are viewed, it is seen that when the impurity concentration of the drift layer is fixed (in the case of FIG. 7), the breakdown voltage remains at the level of 34.0 V, while when the impurity concentration gradient has a substantial V-shape (in the case of FIG. 6), the breakdown voltage increases to 36.4 V. Despite the fact that breakdown voltage is high (the voltage applied to the device is high), the concentration of the electric fields at the crossing point among the drift layer 8, the drain layer 12, and the gate insulating film 2a can be controlled in the similar manner as in the case of FIG. 6.

In this manner, by causing the concentration distribution in the depth direction of the drift layer 8 in the trenches Ta and Tb to have the substantially. V-shaped configuration in the embodiment as shown in FIG. 4, the on resistance of the device can be effectively decreased without decreasing the breakdown voltage. This means that the drift resistance component which is one of the resistance components when the device is in the on state, that is the resistance component of the drift layer 8 is effectively reduced.

As a result, that portion of the on resistance of the device which is the channel resistance component is increased. Accordingly, the channel density can be increased by reducing the device pitch, (the width p in FIG. 1). If the channel resistance component is decreased, it becomes possible to further decrease the on resistance. That is, as a result, a decrease in the on resistance can be achieved as the device unit is made small.

The effect of this embodiment is particularly remarkable in an actual device having the device exemplified in FIG. 1 with a full-pitch structure, which is so small that the width P of the p-type base layer 10 and drift layer 8 sandwiched between the gate insulating films 2a and 2b formed in the adjacent trenched gate structures is less than 0.5 μm.

That is to say, according to this embodiment, when the device is made small in this manner and the percentage of the on resistance which is accounted for by the drift resistance component becomes significant, the drift resistance component is effectively decreased. As a result, it becomes possible for the on resistance of the device to be greatly reduced.

It is to be noted that, in FIG. 4, the impurity concentration profile in the drift layer 8 is varied such that the distribution is a substantially and smoothly continuous curve. However this invention is not limited thereto, and the impurity concentration may be changed such that the distribution is linear or step-shape. That is to say, other distributions may fall within the scope of the present embodiment provided that the impurity concentration of the drift layer 8 has a substantially V-shaped distribution having a minimum value when viewed in the depth direction of the trenches Ta and Tb. Accordingly, in forming the drift layer 8, a plurality of layers having different concentrations of the impurity may be sequentially formed, for example. A manufacturing process of the drift layer 8 will be described later.

Now, the manufacturing process for the power MOSFET of the embodiment shown in FIG. 1 will be described with reference to FIGS. 8A to 8E.

Figure 8A:
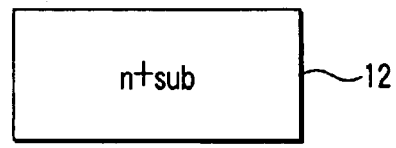
FIGS. 8A to 8E show processes for manufacturing the power MOSFET having the structure shown in FIG. 1 for realizing the impurity concentration distribution of the drift layer shown in FIG. 4 and FIG. 6.
Figure 8B:
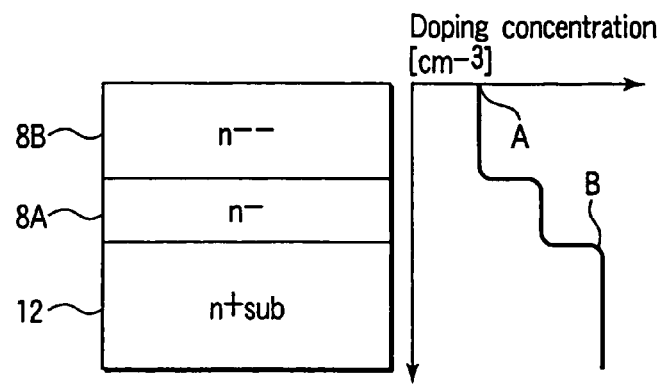
Figure 8C:
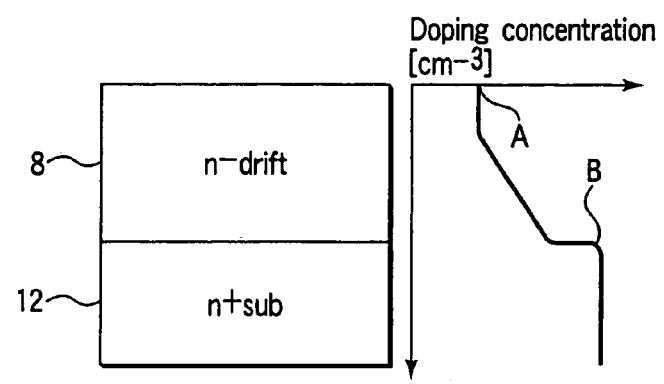

FIG. 8A shows a semiconductor substrate used as the n+ type drain layer 12. As shown in FIG. 8B, an n– type epitaxial layer 8A is grown on the semiconductor substrate 12 by epitaxial growth. Subsequently, an n–– type epitaxial layer 8B of a high resistivity is grown epitaxially on the epitaxial layer 8A. The total thickness of these two epitaxial layers 8A and 8B is set so as to have the same thickness as the n– drift layer 8 of FIG. 1. In this state, the impurity concentration profile of the epitaxial layers 8A and 8B and of the drain layer 12 is as shown at the right side of FIG. 8B. It can be seen that the impurity concentration lessens in a step-shape configuration upward from the semiconductor substrate 12.

In this state the substrate 12 proceeds to a thermal treatment step in which heat is applied to bring the substrate 12 at a predetermined temperature. As a result, thermal diffusion occurs and the differences in the impurity concentration between the semiconductor substrate 12 and the epitaxial layer 8A, as well as that between the epitaxial layers 8A and 8B are made uniform. As shown at the right side of FIG. 8C and in FIG. 2, a substantially linearly increasing impurity concentration distribution profile is formed between portions A and B.

Figure 8D:
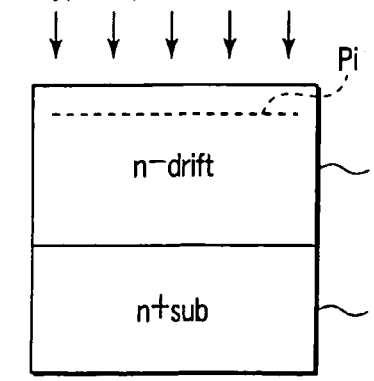
Figure 8E:
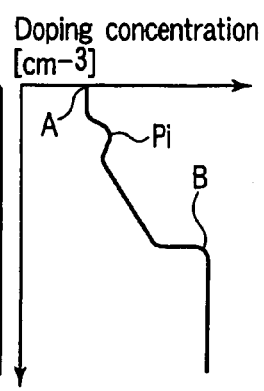

Further, in order to form a profile having the peak Pi of FIG. 4, as shown in FIG. 8D, an n type impurity is implanted from a surface of the drift layer 8 at a predetermined acceleration energy. As a result, n-type impurities are doped with a predetermined concentration at the portion close to the surface of the n-drift layer 8. When heat treatment is carried out in this state, as shown in FIG. 8E, an impurity concentration profile corresponding to that shown in FIG. 4 which has a smooth concentration peak Pi is formed.

In the above description made by referring to FIGS. 8A–8E, a two-layer structure with two epitaxial layers 8A and 8B was described. However, three or more epitaxial layers may be grown thus forming a profile having an even smoother linear curve. In addition, it is not necessary for the formation of the impurity profile by heat treatment to be carried out before a process for forming the device formation of the power MOSFET begins, and this can be carried out using heat treatment such as the diffusion step for the p type base layer 10.

The following describes some embodiments and modifications of power MOSFETS according to the present invention. In the following, the explanations will be given not by referring to the full-pitch structure such as shown in FIG. 1 but by referring to a half-pitch structure formed with respect to the right side trench Ta shown in FIG. 1. Further, the portions shown in the following figures corresponding to those shown in FIG. 1 are designated by the same or similar reference numerals and the explanations thereof will be omitted.

Figure 9:
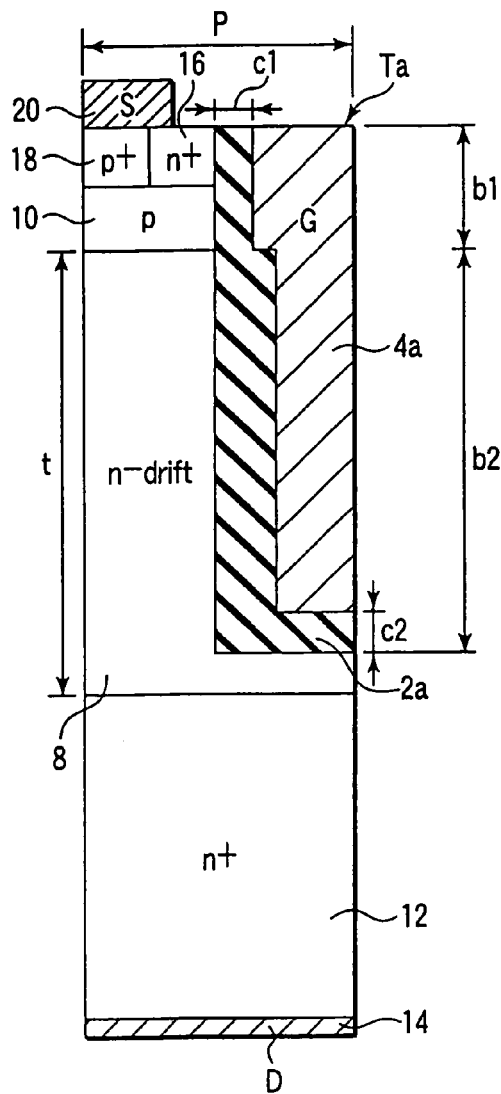
FIG. 9 is a cross-sectional view of the main portions of a modification of the first embodiment of a power MOSFET of the present invention shown in FIG. 1.

FIG. 9 is a cross-sectional view of the main portions of a modification of a power MOSFET of the first embodiment of the present invention shown in FIG. 1. In this modification of FIG. 9, the trenched gate structure includes a gate insulating film 2a which has an end terminated in the n type drift layer 8. In other words, the film 2a is not extended into the drain layer 12. The remaining structure is the same as that of FIG. 1.

In this modification too, the drift layer 8 has an impurity concentration distribution like that exemplified in FIG. 2 or FIG. 4. Further, in this modification, the trenched gate structure does not penetrate the n type drift layer 8, but terminates at level above the bottom of the drift layer 8. In applications in which the breakdown voltage takes priority over the on resistance of the device, this type of structure is sometimes favorable.

Figure 10:
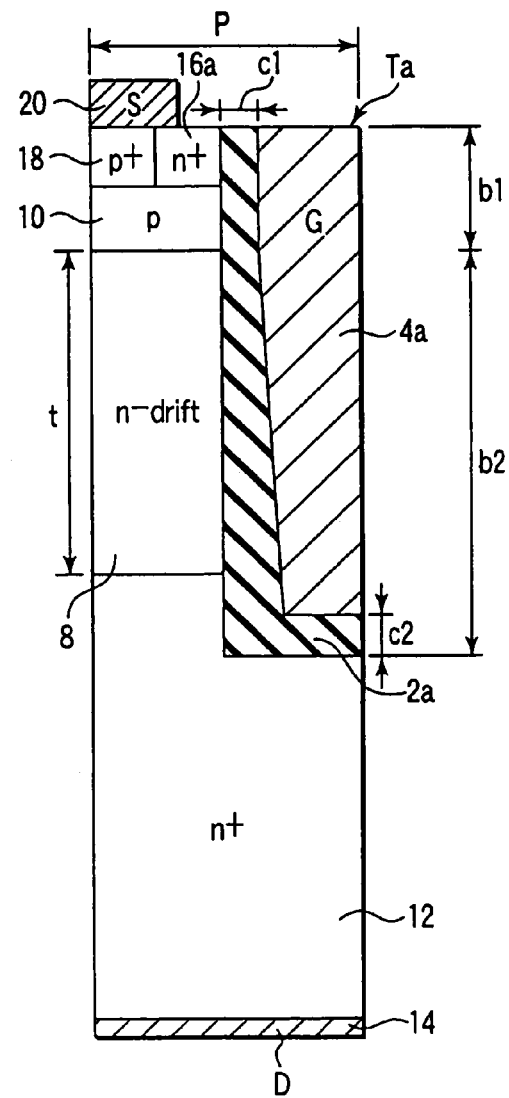
FIG. 10 is a cross-sectional view of the main portions of another modification of the first embodiment of a power MOSFET of the present invention shown in FIG. 1.

FIG. 10 is a cross-section of the main portions of a second modification of the MOSFET of the present invention shown in FIG. 1. In FIG. 10, the same numbers have been assigned to the portions which are the same as those in FIGS. 1 to 9 and thus detailed explanations thereof have been omitted.

In this second modification too, the drift layer 8 has an impurity concentration distribution like that exemplified in FIG. 2 or FIG. 4. Further, in this modification, the film thickness of the portion b2 of the gate insulating film 2 has a distribution such that it is sequentially increased in the depth direction of the trench Ta. Even when the thickness has such a distribution, in the portion adjacent to the drift layer 8, a portion of the voltage which is applied between the gate G (or the source S) and the drain D is held by the thick gate insulating film 2a without increasing the threshold value of the device. Thus the thickness t of the drift layer 8 can be decreased and the drift resistance component can be decreased.

Figure 11:
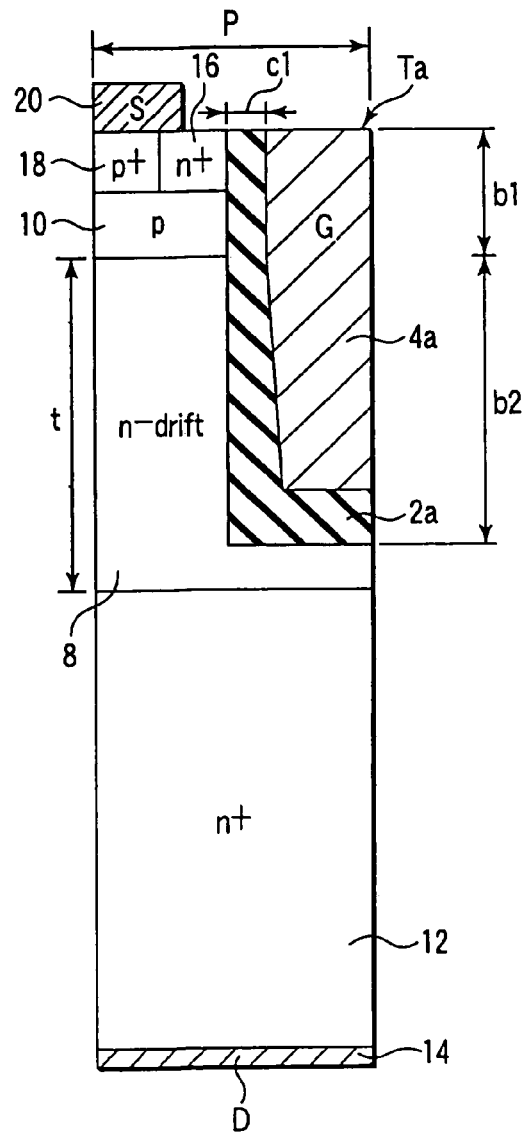
FIG. 11 is a cross-sectional view of the main portions of a further modification of the first embodiment of a power MOSFET of the present invention shown in FIG. 1.

It is to be noted that in the modification shown in FIG. 10, the trenched gate structure penetrates the drift layer 8, but as exemplified in FIG. 11, the trenched gate structure may be ended at a portion above the bottom of the drift layer 8.

Figure 12:
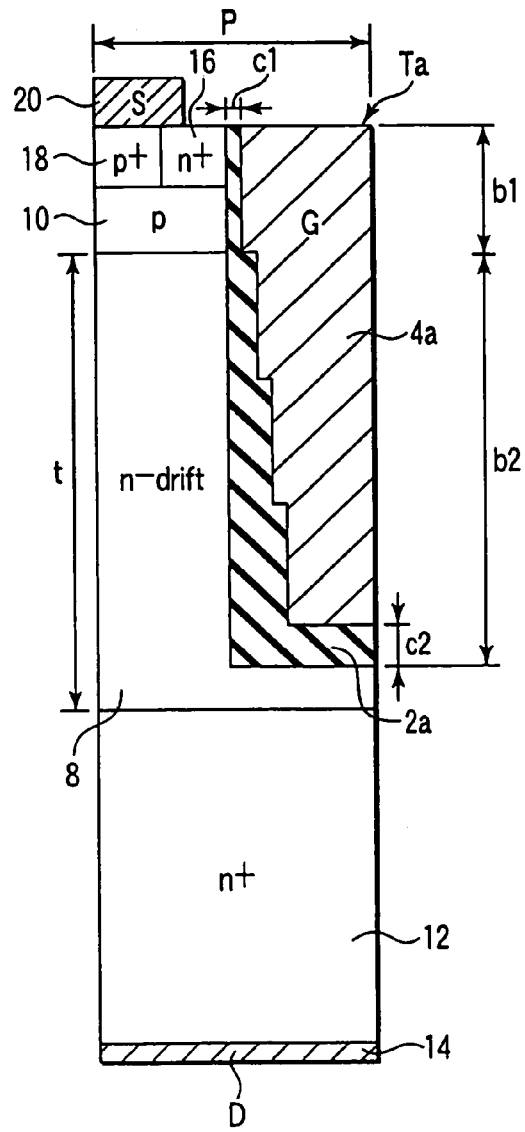
FIG. 12 is a cross-sectional view of the main portions of a power MOSFET of a still further modification of the embodiment shown in FIG. 1.

FIG. 12 is a cross-sectional view showing the main portions of a further modification of the power MOSFET of the present invention shown in FIG. 1. In FIG. 12 also, the same numbers have been assigned to the parts which are the same as those in FIGS. 1 to 11 and thus detailed explanations thereof have been omitted.

In this modification too, the drift layer 8 has a impurity concentration distribution such as that exemplified in FIG. 2 or FIG. 4. Further, in this modification, the thickness of the portion b2 in the gate insulating film 2 has a distribution such that it increases step-wise in the depth direction of the trench Ta. Even when the thickness has such a distribution, in the portion adjacent to the drift layer 8, a portion of the voltage which is applied between the gate G (or the source S) and the drain D is held by the thick gate insulating film 2a without increasing the threshold value of the device. Thus the thickness t of the drift layer 8 can be decreased and the drift resistance component can be decreased.

Figure 13:
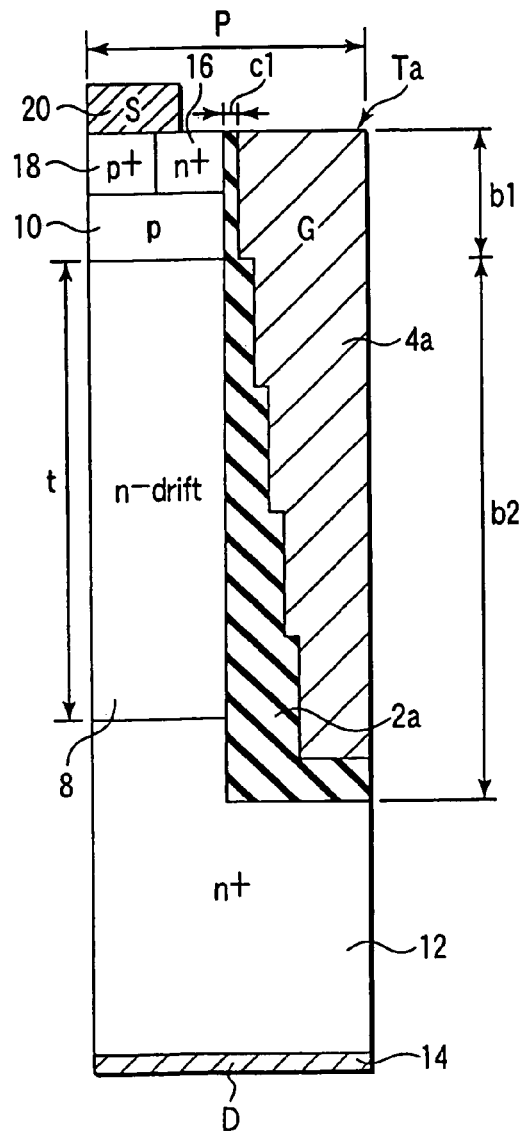
FIG. 13 is a cross-sectional view of the main portions of a power MOSFET of a still further modification of the embodiment shown in FIG. 1.

It is to be noted that in the example shown in FIG. 12, the trenched gate structure terminates at a level above the bottom of the drift layer 8, but as exemplified in FIG. 13, the trenched gate structure may also penetrate the drift layer 8.

The embodiments and modifications shown in FIGS. 1 to 13 each has the p type base layer 10 provided between the n type source region 16a (16b) and n type drift layer 8 to form an inversion layer in the base layer 10 by applying a gate voltage to the gate electrode 4a (4b) in the on state of the device, thereby flowing on current in the channel formed in the inversion layer.

The present invention is not limited to this type of embodiments and modifications. It is applicable to a power MOSFET having a structure including a high resistivity base layer of the same conductivity type as those of the source region and the drift layer. When the device is turned on, a storage layer of a majority carrier is formed in the base layer by applying a gate voltage to the gate electrode. The storage layer is used as a channel.

Figure 14:
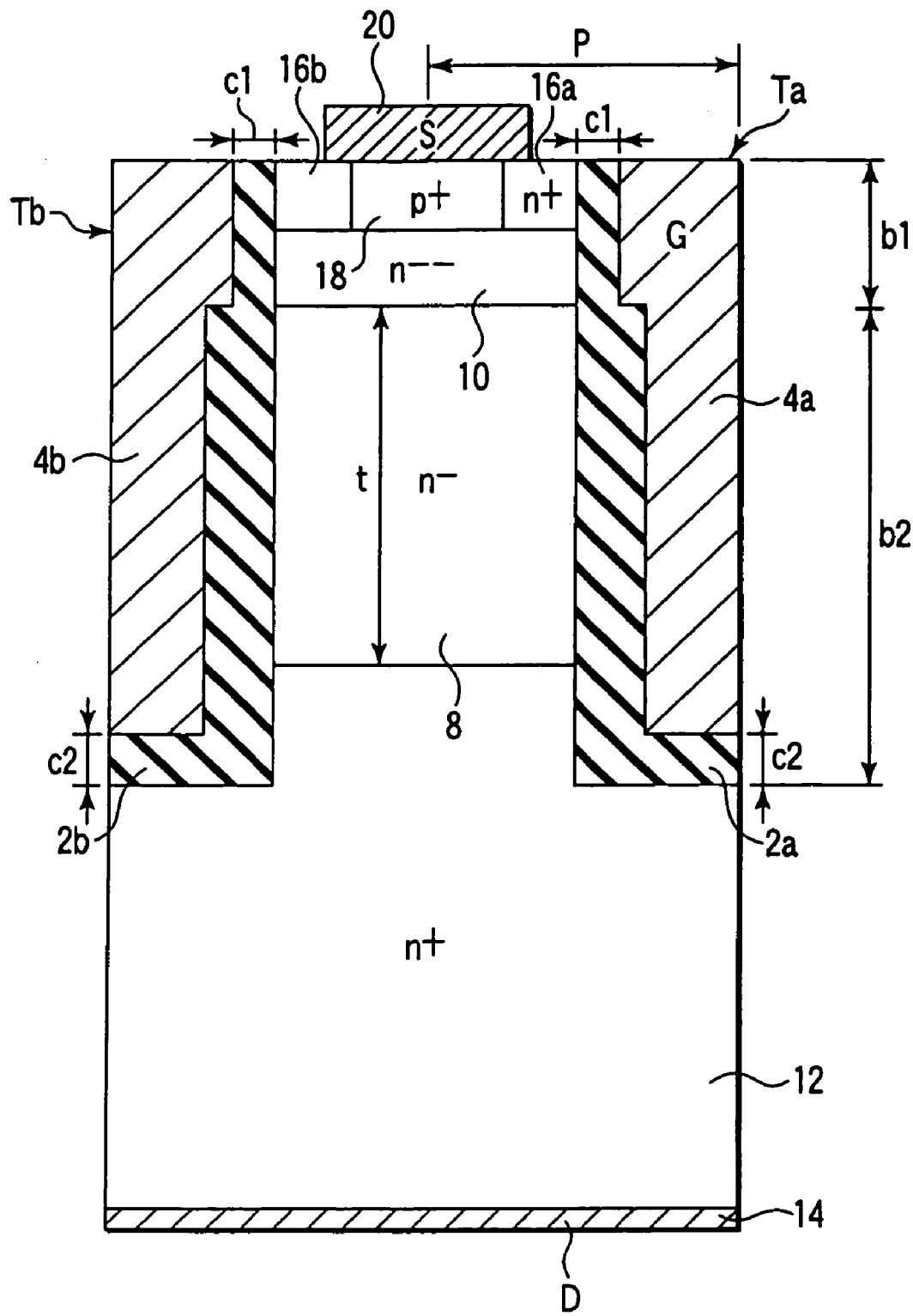
FIG. 14 is a cross-sectional view of a power MOSFET according to another embodiment of the present invention.

FIG. 14 shows a cross-sectional view of an embodiment having the base layer forming the storage layer. In this embodiment, only the p type base layer 10 shown in FIG. 1 is changed to n–– type base layer 10 and the remaining portions are the same as those shown in FIG. 1, so that the detailed explanations are omitted here.

In the embodiment of FIG. 14, when the device is turned on, in a portion of the n–– type base layer 10 adjacent to the gate electrode 4a (4b) a storage layer of electrons is formed by the gate voltage applied to the gate electrodes 4a and 4b. The on current of the device passes through this storage layer from the source region 16a (16b) to the drain layer 12. When no on voltage is applied to the gate electrode 4a (4b), or when the device is in off state, the base layer 10 is depleted to cut off the current in the drift layer 8.

In this case too, since the portion b2 of the gate insulating film 2a (2b) facing the drift layer 8 is made thick in the similar manner as in the case of FIG. 1, a part of the voltage applied across the source/drain electrodes 20 and 14 can be held by the thick portion, thereby realizing a high breakdown voltage.

Further, since the impurity concentration distribution of the drift layer 8 can be set as shown in FIG. 2 or FIG. 4, it is possible to decrease the on resistance of the device and the electric field concentration at the boundary of the drift layer 8 and the drain layer 12 can be reduced.

The storage layer formed in the base layer 10 makes the channel region be thick and deep in the base layer 10, thereby enlarging the sectional area of the channel region. Further, it is possible to increase the impurity concentration at the surface of the channel region. Therefore, a channel resistance can be reduced and the on resistance of the device can also be decreased further.

Figure 15:
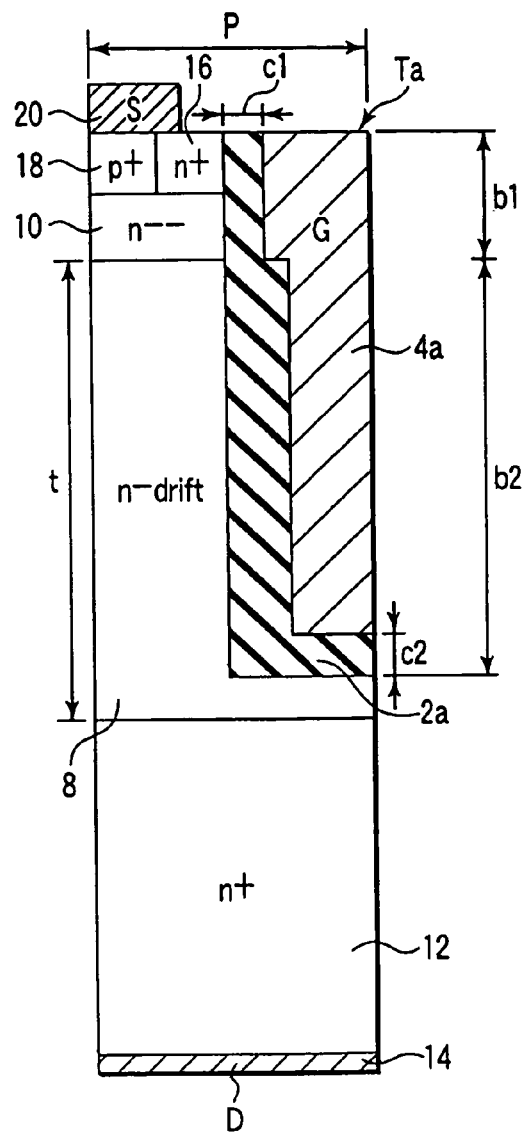
FIG. 15 is a cross-sectional view of a modification of the power MOSFET shown in FIG. 14.

FIG. 15 shows a modification of the embodiment shown in FIG. 14, in which the lower end of the trenched gate structure constituted by the gate insulating film 2a and the gate electrode 4a is formed to terminate at the inner part of the drift layer 8.

In this modification too, the drift layer 8 has an impurity concentration distribution like that exemplified in FIG. 2 or FIG. 4. Further, in this modification, the trenched gate structure does not penetrate the n type drift layer 8, but terminates at level above the bottom of the drift layer 8. In applications in which the breakdown voltage takes priority over the on resistance of the device, this type of structure is sometimes favorable.

Figure 16:
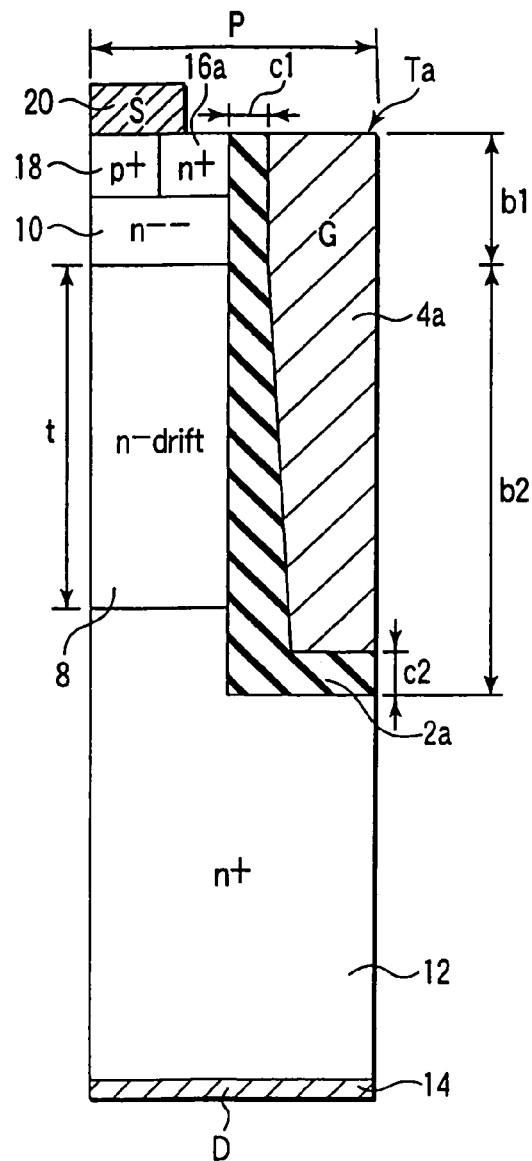
FIG. 16 is a cross-sectional view of another modification of the power MOSFET shown in FIG. 14.

FIG. 16 shows a cross-sectional view of a further modification of the embodiment shown in FIG. 14. As in the modification shown in FIG. 10, the trenched gate structure formed of the gate insulating film 2a and the gate electrode 4a penetrates the n type drift layer 8, and terminates at an intermediate part of the drain layer 12.

In this second modification too, the drift layer 8 has an impurity concentration distribution like that exemplified in FIG. 2 or FIG. 4. Further, in this modification, the film thickness of the portion b2 of the gate insulating film 2 has a distribution such that it is sequentially increased in the depth direction of the trench Ta. Even when the thickness has such a distribution, in the portion adjacent to the drift layer 8, a portion of the voltage which is applied between the gate G (or the source S) and the drain D is held by the thick gate insulating film 2a without increasing the threshold value of the device. Thus the thickness t of the drift layer 8 can be decreased and the drift resistance component can be decreased.

Figure 17:
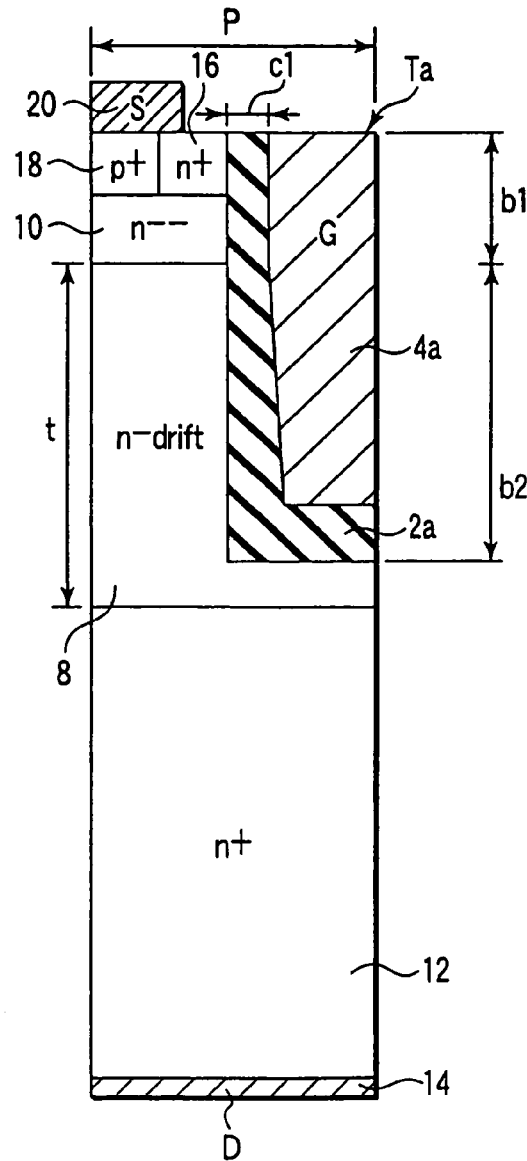
FIG. 17 is a cross-sectional view of further modification of the power MOSFET shown in FIG. 14.

In the modification shown in FIG. 16, the trenched gate structure formed of the gate insulating film 2a and the gate electrode 4a penetrates the n type drift layer 8, and terminates at an intermediate part of the drain layer 12. Further, it is possible to form a structure as shown in FIG. 17 having the end of the trenched gate structure terminates at an intermediate portion of the drift layer 8.

Figure 18:
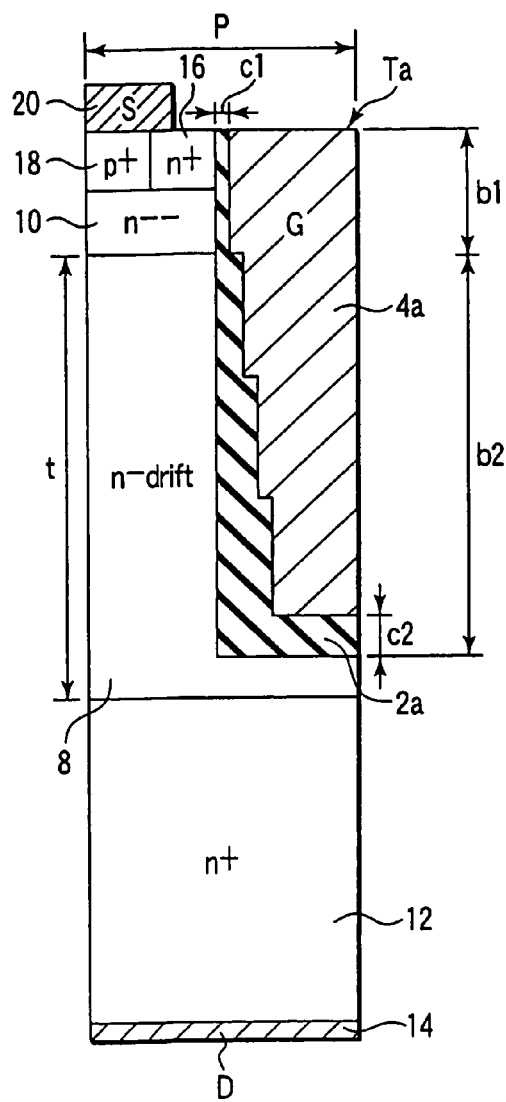
FIG. 18 is a cross-sectional view of a still further modification of the power MOSFET shown in FIG. 14.

FIG. 18 shows a cross-sectional view of a further modification of the embodiment shown in FIG. 14. As in the case of FIGS. 14–17, the portions similar to those shown in FIGS. 14–17 are designated by the same reference numerals and the detailed explanation thereof may be omitted here.

In this modification shown in FIG. 18 too, the drift layer 8 has an impurity concentration distribution like that exemplified in FIG. 2 or FIG. 4. Further, in this modification, the film thickness of the portion b2 of the gate insulating film 2 has a distribution such that it is increased in a step like fashion in the depth direction of the trench Ta. Even when the thickness has such a distribution, in the portion adjacent to the drift layer 8, a portion of the voltage which is applied between the gate G (or the source S) and the drain D is held by the thick gate insulating film 2a without increasing the threshold value of the device. Thus the thickness t of the drift layer 8 can be decreased and the drift resistance component can be decreased.

Figure 19:
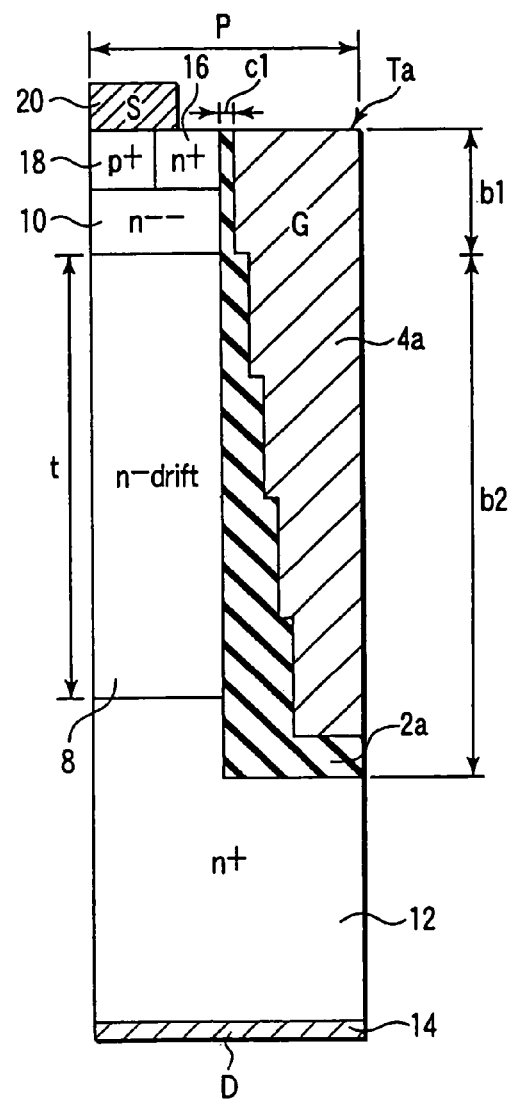
FIG. 19 is a cross-sectional view of a still further modification of the power MOSFET shown in FIG. 14.

In the modification shown in FIG. 18, the trenched gate structure formed of the gate insulating film 2a and the gate electrode 4a terminates at the intermediate portion of the n type drift layer 8. Further, it is possible to form a structure as shown in FIG. 19 having the end of the trenched gate structure penetrates the drift layer 8 to reach at an intermediate portion of the drain layer 12.

The embodiments and modifications of the present invention have been described above with reference to concrete examples. However, the invention is not to be limited thereby.

For example, the dimensions, configurations, semiconductor types, impurity concentrations, amounts and the like in each of the example may be suitably selected by one skilled in the art. To the extent that such embodiments or modifications achieve the same effect of the present invention, they are intended to be included within the scope thereof.

As described in detail above, in the embodiments of the present invention, the channel portion of the gate insulating film is made thin, and the portion of the gate insulating film adjacent to the drift layer is made thick. As a result, the gate insulating film can be made to hold a part of the applied voltage and the thickness of the drift layer can be decreased without increasing the threshold value of the device. As a result, the drift resistance component is decreased and the on resistance of the device is effectively decreased.

Further, by causing the impurity concentration of the drift layer to have a distribution which increases sequentially when viewed in the depth direction of the trench, the breakdown voltage is maintained and the drift resistance component is effectively decreased. That is, it becomes possible to reduce the on resistance of the device while maintaining breakdown voltage.

In summary, the present invention makes it possible to provide a vertical type power MOSFET in which breakdown voltage is maintained while the on resistance is reduced, and this has many merits with respect to manufacturing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a power MOSFET, comprising:
    epitaxially growing a drift layer of a first conductivity type on a first conductivity type semiconductor substrate used as a drain layer, said drift layer being doped with impurities having a concentration distribution increasing up to said semiconductor substrate;
    epitaxially growing a base layer of a second conductivity type on said drift layer;
    forming a source region of the first conductivity type on said base layer;
    forming a trench penetrating said source region and said base layer to reach at said drift layer; and
    forming a trenched gate structure including a gate insulating film and a gate electrode, said gate insulating film having a thin portion facing said base layer and a thick portion facing said drift layer and having a bottom portion reaching into the drain layer,
    wherein said growing the drift layer comprises:
    forming a first epitaxial layer of the first conductivity type on said semiconductor substrate with a first impurity concentration;
    forming a second epitaxial layer of the first conductivity type on said first epitaxial layer with a second impurity concentration lower than the first impurity concentration of said first epitaxial layer; and heat treating said first and second epitaxial layers for smoothing the first and second impurity concentrations.

2. The method of manufacturing a power MOSFET according to claim 1, which further comprises:
   implanting impurities from a surface of said second epitaxial layer up to a predetermined depth thereof; and
   diffusing the implanted impurities into said second epitaxial layer to form a peak of the impurity concentration in said second epitaxial layer.

3. A method of manufacturing a power MOSFET, comprising:
   epitaxially growing a drift layer of a first conductivity type on a first conductivity type semiconductor substrate used as a drain layer, said drift layer being doped with impurities having a concentration distribution increasing up to said semiconductor substrate;
   epitaxially growing a base layer of a second conductivity type on said drift layer;
   forming a source region of the first conductivity type on said base layer;
   forming a trench penetrating said source region and said base layer to reach at said drift layer; and
   forming a trenched gate structure including a gate insulating film and a gate electrode, said gate insulating film having a thin portion facing said base layer and a thick portion facing said drift layer,
   wherein said growing the drift layer comprises,
      forming a first epitaxial layer of the first conductivity type on said semiconductor substrate with a first impurity concentration,
      forming a second epitaxial layer of the first conductivity type on said first epitaxial layer with a second impurity concentration lower than the first impurity concentration of said first epitaxial layer, and
      heat treating said first and second epitaxial layers for smoothing the first and second impurity concentrations.

4. A method of manufacturing a power MOSFET, comprising:
   epitaxially growing a drift layer of a first conductivity type on a first conductivity type semiconductor substrate used as a drain layer, said drift layer being doped with impurities having a concentration distribution increasing up to said semiconductor substrate;
   epitaxially growing a base layer of a second conductivity type on said drift layer;
   forming a source region of the first conductivity type on said base layer;
   forming a trench penetrating said source region and said base layer to reach at said drift layer; and
   forming a trenched gate structure including a gate insulating film and a gate electrode, said gate insulating film having a thin portion facing said base layer and a thick portion facing said drift layer,
   wherein said growing the drift layer comprises,
      forming a first epitaxial layer of the first conductivity type on said semiconductor substrate with a first impurity concentration,
      forming a second epitaxial layer of the first conductivity type on said first epitaxial layer with a second impurity concentration lower than the first impurity concentration of said first epitaxial layer,
      heat treating said first and second epitaxial layers for smoothing the first and second impurity concentrations,
      implanting impurities from a surface of said second epitaxial layer up to a predetermined depth thereof, and
      diffusing the implanted impurities into said second epitaxial layer to form a peak of the impurity concentration in said second epitaxial layer.

* * * * *